PRINTED WIRE CIRCUIT CARD INTERCONNECTION APPARATUS

Filed Nov. 12, 1954

INVENTORS: L. PEDERSEN
A. J. WIER
BY John C. Morris
ATTORNEY

United States Patent Office 2,832,013

Patented Apr. 22, 1958

2,832,013

PRINTED WIRE CIRCUIT CARD INTERCONNECTION APPARATUS

Ludwig Pedersen, Brookside, and Anthony J. Wier, Cranford, N. J., assignors to Bell Telephone Laboratories, Incorporated, New York, N. Y., a corporation of New York Application November 12, 1954, Serial No. 468,436

1 Claim. (Cl. 317—101)

This invention relates to electronic assembly mounting and interconnection systems and more specifically to a quick detachable arrangement for mounting and interconnecting an array of electrical component mounting panels, for example, printed electronic circuit boards.

The use of printed circuits in the form of thin conductive strips adherent to panels or boards of insulating material is a well recognized advance in the electrical communication art. Printed circuit boards or cards enable the use of miniaturized components with consequent space-saving, and further, such boards lend themselves to mass production methods and ease of maintenance. It has been found advantageous for reasons of accessibility and economy of space to mount the boards or panels, to which the printed circuits and electrical components are affixed, in arrays or banks of various types. Such arrangements find a wide variety of use, for example in central office telephone equipment of the carrier type, in outlying carrier telephone equipments, radio transmitting and receiving apparatus, and various types of computing equipment.

It is an object of this invention to provide an improved arrangement for mounting and interconnecting electrical component mounting boards.

Within this general objective are included the additional objectives of providing a readily detachable yet secure mounting for printed circuit boards which enables accessibility, simplicity, and ease of maintenance along with improved electrical contact.

One specific embodiment of this invention comprises a pair of side rails which may be secured within an electrical mounting panel or bay. Mounted at spaced intervals between the side rails are support members comprising parallel connecting members and end portions, the latter having slots or grooves therein for receiving the edges of printed circuit boards, which are thus arranged in parallel spaced-apart array. Secured to the support members, as by embedding within the connecting members, which bridge the side rails, are a number of parallel spaced-apart wire conductors which function as interconnection busses between the printed circuit components and input and output terminals. The interconnecting wires thus are generally parallel to the side rails and normal to the planes of the printed circuit boards. Affixed to the printed circuit boards are connector clips which project beyond that edge of the board abutting the buss wires and into the space between the connecting members, thus enabling each connector clip to grasp a corresponding wire. Each such connector clip forms a terminal for a particular circuit or component of the mounting board.

Thus, one feature of this invention resides in the support members carrying the parallel buss wires and having slots for receiving the printed circuit elements therein. A further feature is found in the connector clips which are fixedly attached to the printed circuit boards and resiliently attached to the interconnecting wires.

The invention and the above-noted and other features will be more clearly and fully understood from the following detailed description taken in connection with the accompanying drawing, in which.

Figures 1, 2, 3, 4:
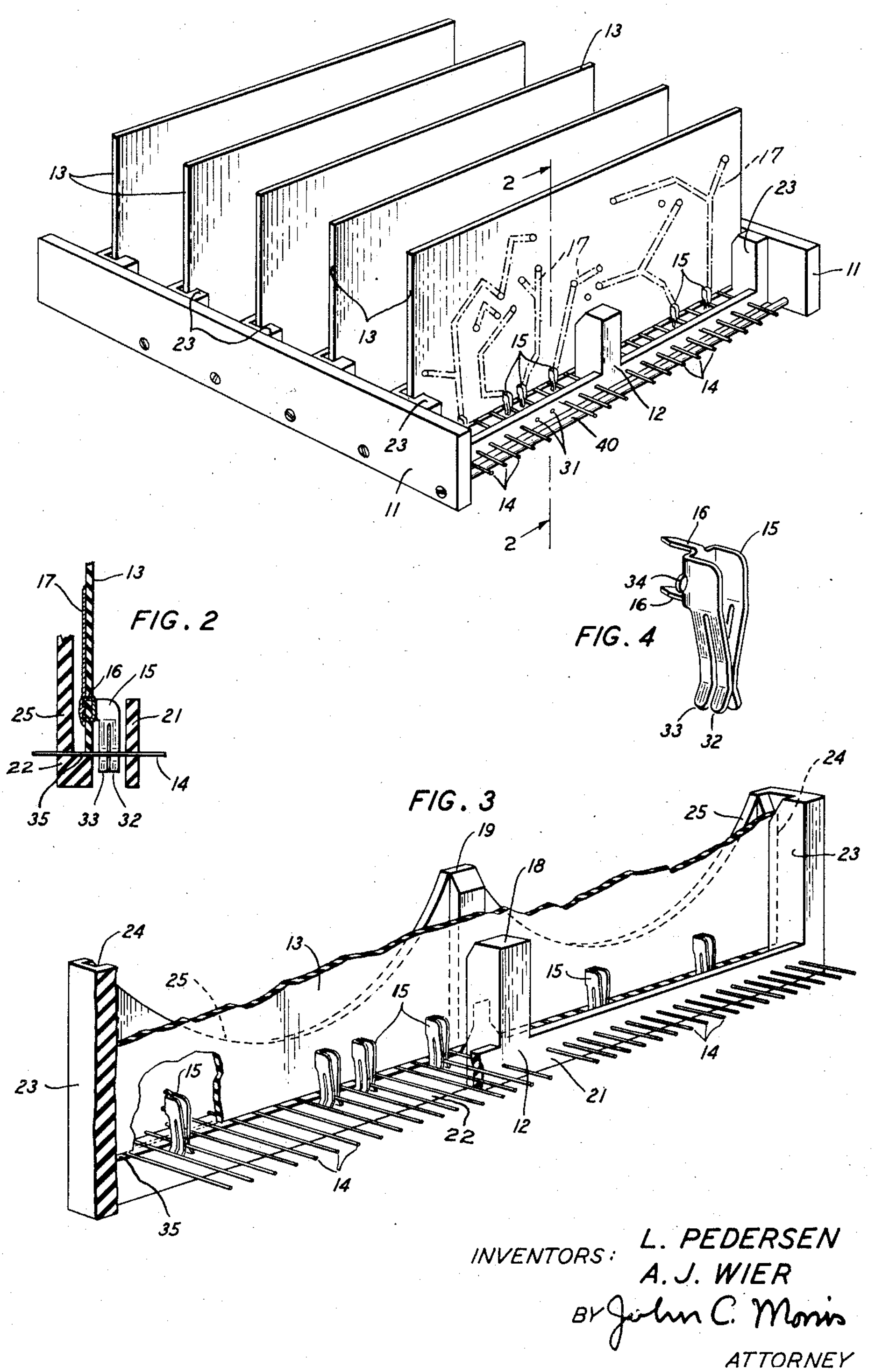
Fig. 1 is a perspective view of a mounted array of interconnected printed circuit boards, omitting for clarity any printed circuits or components thereof.
Fig. 2 is a sectional view taken on the line 2—2 of Fig. 1, through the support member and one circuit board depicting the mode of affixing the connector clips.
Fig. 3 is a perspective view, partially in section of one support member with a cut-away circuit board mounted therein.
Fig. 4 is a perspective view of a connector clip of this invention.

Referring first to Fig. 1, there is shown the supporting side rails 11, which, it is to be understood, are secured in any convenient manner in a panel or bay type of mounting. Thus, the side rails may be of any of a number of the metals commonly used for electrical mountings, for example, aluminum or they may be, but not necessarily, of insulating material having the requisite strength. Generally, it has been found advantageous from an installation and maintenance standpoint to mount the array with the printed boards in a substantially horizontal position.

Spanning the side rails 11 and secured thereto are the support members or channels 12 which function as receptacles for the printed circuit boards 13. These support members 12 comprise the beam or connecting portions 21 and 22 which span the distance between the end portions 23. The end portions contain vertical grooves 24 for receiving the printed cards in proper alignment. At the mid-point of the connecting members 21 and 22 are extended portions 18 and 19, respectively, which provide additional support for retaining the printed boards in proper position. Added strength is attained by the inclusion of the webbing 25 on the support member 22 between the extended portion 19 and the end portions 23. Thus, these support members 12 act also as board straighteners to reduce the tendency of the printed circuit members to bend or warp.

While not specifically shown, it will be recognized by those skilled in the art, that the molded support members are most advantageously secured to the side rails by means which permit small expansions and contractions of the molded insulating material with changes in temperature. For example, the end portions 23 may rest in socket-like members secured to the side rails 11. Such sockets are of sufficient size to permit the support members 12 to "float" in a small degree in their mounting. Or alternatively, the side rails themselves may be channeled vertically for some distance from the top edge sufficient to enable insertion of the end portions 23 which may then be secured by the use of a retainer bar along the top edges of the side rails 11. Rigid support between the side rails is provided by tie rods 40 which fix the spacing between side rails.

Secured to the support members 12, as by embedding in the connecting members 21 and 22, are a plurality of parallel interconnecting wires 14 which serve to connect the various circuit elements, not shown, but which it will be understood are affixed to the boards 13. Connector clips 15 are secured to the circuit boards 13, each connector being in electrical contact with a particular circuit or component affixed to the board. Representative printed wiring is indicated on the reverse side of the foremost board by the conductors 17 shown in dotted outline. The interconnecting wires 14 are not necessarily continuous throughout the length of a particular assembly, but may be severed at various points, as depicted by the several wires numbered 31, to attain the desired interconnection of board terminals. In this way, any one wire path may serve more than one circuit thereby increasing the capacity of the assembly.

The connector clips 15 comprise pairs of resilient fingers which firmly grasp a corresponding interconnecting wire 14 when the circuit board 13 is pressed inwardly into the support member 12.

Referring to Fig. 4, which depicts a connector clip in greater detail, the unique and advantageous construction of this member is recognized. The clip may be produced as a die-stamped article observing certain important features. The bifurcated members or fingers 32 and 33 are rather precisely predeflected in order to ensure positive and continuous contact to whatever type of mating member may be employed. Thus, any slight misalignment or irregularity will not result in failure of the connection but rather there will be at least one of the four fingers which will, in effect, follow its opposing member and remain in contact. It has also been found advantageous to form these connectors with ears 34 of which there are two on each connector. These ears provide the necessary support against sideward deflection or "rocking" of the connectors from their mounted positions which may result in short circuits between terminals.

As shown more clearly in Fig. 2, the support member 12 has a ledge portion 35 supporting the interconnecting wires 14 which act as a stop or base for the circuit board 13. Fig. 2 also depicts the specific manner in which the connector clips 15 are affixed to the board 13, comprising in effect a staple 16 to which electrical contact is made from the printed circuit indicated by the conductive layer 17.

It will be understood that in any one printed circuit board all interconnecting wires 14 are not necessarily connected to the board terminals. As indicated in Fig. 3 only a part of the total wires may be connected as dictated by the particular circuit configuration. This feature has the effect of multiplying the number of wire paths available for interconnection.

It will be recognized further than the foregoing embodiment of this invention provides a durable, stable, quick-detachable mounting arrangement for printed circuit boards, adaptable likewise for use with other types of modular panel or card-mounted assemblies. Once installed each board is retained by the connector clips 15 resiliently attached to the wires 14. In certain applications, particularly where the apparatus is subject to vibration, it will be advantageous to provide a cover member or the like to ensure against derangement of the boards. Other types of interconnecting means and plugs may be employed for connecting to the terminal clips thereby adding further to the adaptability of this invention.

It will be understood that the above-described embodiment is illustrative and that various modifications may be made by those skilled in the art without departing from the scope and spirit of this invention.

What is claimed is:

In telephone terminal apparatus comprising an array of electrically interconnected printed circuit boards, said boards having circuit terminations along an edge thereof, a pair of parallel spaced-apart side rail members, tie rod members connecting said side rail members, insulating support members mounted between said side rails for receiving said boards in parallel spaced-apart array, each said member comprising a transverse beam member having a troughlike longitudinal recess in the upper portion thereof and having extended portions from the mid-point of the upper side for stabilizing said boards and end portions having vertically disposed grooves in their inward surface for receiving said printed circuit boards, a plurality of interconnecting wires in parallel spaced relation embedded in said beam members in substantially perpendicular relation thereto, and connector clip members secured to said board members and electrically connected to said printed circuits, each said clip member comprising a bifurcated spring metal member having a substantially U-shaped base portion at one end, a plurality of pairs of opposed fingers at the other end, said opposed fingers having spring tension toward each other, tab members projecting from said base portion through holes in said board coincident with a termination of said printed circuits, said tab members being clinched to said board and ear members transversely disposed to said fingers for inhibiting sideward deflection of each said connector member on said board, said opposed fingers extending below the lower edge of said printed circuit board for engaging said interconnecting wires when said board is inserted in said insulating support member.

References Cited in the file of this patent

UNITED STATES PATENTS

| | | |
|---|---|---|
| 233,968 | Bergmann | Nov. 2, 1880 |
| 1,168,774 | Adam | Jan. 18, 1916 |
| 1,560,778 | Goddard | Nov. 10, 1925 |
| 2,438,454 | Riebe | Mar. 23, 1948 |
| 2,475,448 | Cusato | July 5, 1949 |
| 2,596,237 | Gross et al. | May 13, 1952 |
| 2,701,346 | Powell | Feb. 1, 1955 |
| 2,734,151 | Jacobs | Feb. 7, 1956 |

FOREIGN PATENTS

| | | |
|---|---|---|
| 592,686 | Great Britain | Sept. 25, 1947 |